(12) United States Patent
Trachuk et al.

(10) Patent No.: US 9,673,069 B2
(45) Date of Patent: Jun. 6, 2017

(54) HIGH FREQUENCY FILTER FOR IMPROVED RF BIAS SIGNAL STABILITY

(71) Applicant: APPLIED MATERIALS, INC., Santa Clara, CA (US)

(72) Inventors: Yuri Trachuk, Santa Clara, CA (US); Robert Chebi, San Carlos, CA (US); Carl Almgren, Fort Collins, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 53 days.

(21) Appl. No.: 13/945,756

(22) Filed: Jul. 18, 2013

(65) Prior Publication Data

US 2014/0162462 A1  Jun. 12, 2014

Related U.S. Application Data

(60) Provisional application No. 61/674,163, filed on Jul. 20, 2012.

(51) Int. Cl.
| | |
|---|---|
| *C23C 16/00* | (2006.01) |
| *C23F 1/00* | (2006.01) |
| *H01L 21/306* | (2006.01) |
| *H01L 21/67* | (2006.01) |
| *H05H 1/46* | (2006.01) |
| *H01J 37/32* | (2006.01) |
| *H01L 21/3065* | (2006.01) |

(52) U.S. Cl.
CPC ...... *H01L 21/67069* (2013.01); *H01J 37/321* (2013.01); *H01J 37/32174* (2013.01); *H01L 21/3065* (2013.01); *H05H 1/46* (2013.01); *H05H 2001/4682* (2013.01)

(58) Field of Classification Search
CPC ...................................... H05H 1/46

USPC ........... 156/345.41–345.49, 345.24–345.28; 118/715, 722, 723 R, 723 I, 723 IR, 118/723 E, 723 ER, 723 MW, 723 MR, 118/273 ME, 723 MA, 723 AN, 73 ME; 315/111.21
See application file for complete search history.

(56) References Cited

U.S. PATENT DOCUMENTS

| | | | |
|---|---|---|---|
| 6,411,490 B2 * | 6/2002 | Dible | ............................ 361/234 |
| 6,537,421 B2 | 3/2003 | Drewery | |
| 6,623,596 B1 | 9/2003 | Collins et al. | |
| 7,004,107 B1 | 2/2006 | Raoux et al. | |
| 7,415,940 B2 | 8/2008 | Koshimizu et al. | |

(Continued)

FOREIGN PATENT DOCUMENTS

JP    WO 2010/100702    *   9/2010

OTHER PUBLICATIONS

International Search Report dated Oct. 25, 2013 for International Application No. PCT/US2013/051330, 3 pages.

*Primary Examiner* — Rakesh Dhingra
(74) *Attorney, Agent, or Firm* — Kilpatrick Townsend & Stockton LLP

(57) ABSTRACT

A plasma-assisted etch process for the manufacture of semiconductor or MEMS devices employs an RF source to generate a plasma that is terminated through an electrode. The termination is designed as a "short" at the frequency of the RF source to minimize voltage fluctuations on the electrode due to the RF source energy. The electrode voltage potential can then be accurately controlled with a bias source, resulting in improved control of etch depth of a semiconductor substrate disposed on the electrode.

14 Claims, 6 Drawing Sheets

(56) References Cited

U.S. PATENT DOCUMENTS

| | | | |
|---|---|---|---|
| 2004/0135590 A1* | 7/2004 | Quon | G01R 27/2641 |
| | | | 324/713 |
| 2005/0103439 A1* | 5/2005 | Goodman | H01J 37/32082 |
| | | | 156/345.28 |
| 2006/0081564 A1 | 4/2006 | Moroz et al. | |
| 2008/0029385 A1* | 2/2008 | Koshimizu | H01J 37/32091 |
| | | | 204/164 |
| 2008/0180028 A1* | 7/2008 | Collins et al. | 315/111.21 |
| 2008/0277062 A1* | 11/2008 | Koshimizu | H01J 37/32082 |
| | | | 156/345.28 |
| 2009/0236214 A1 | 9/2009 | Janakiraman et al. | |
| 2010/0294433 A1* | 11/2010 | Jianhui | H01J 37/32091 |
| | | | 156/345.48 |
| 2012/0115257 A1* | 5/2012 | Matsuyama | C23C 16/24 |
| | | | 438/10 |

* cited by examiner

HIGH FREQUENCY FILTER FOR IMPROVED RF BIAS SIGNAL STABILITY

CROSS-REFERENCE TO RELATED APPLICATIONS

This application claims priority to Provisional Application No. 61/674,163, filed Jul. 20, 2012, titled "HIGH FREQUENCY FILTER FOR IMPROVED RF BIAS SIGNAL STABILITY", which is hereby incorporated by reference in its entirety.

BACKGROUND

Semiconductor and micro electro mechanical systems (MEMS) devices require myriad manufacturing processes to form the required complex electrical and mechanical structures. These devices are continually being reduced in size, resulting in associated tighter manufacturing process tolerances. One such manufacturing process employed is a plasma-assisted etch process.

Manufacturing variables of an etch process may result in a broad statistical distribution for the dimensions of the structures formed within a group of wafers being etched. Moreover, variability in the manufacturing process can also cause statistical distributions in structural dimensions within a single wafer. Such variations may be too great to enable efficient production of the devices.

For example, during the manufacture of semiconductor or MEMS devices, trenches are often etched into substrate materials. Although it is often desirable to etch trenches that have a uniform depth across the wafer and do not vary from wafer to wafer, it may be difficult to etch such structures.

SUMMARY

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

Embodiments of the invention include plasma etching and/or deposition systems having a Radio Frequency (RF) power delivery system designed to deliver RF source energy so that it that forms a plasma within a processing chamber. The RF source energy may be configured to be terminated to ground through an electrode disposed within the processing chamber. A bias drive source may apply a bias to the electrode to control the directionality of the ions from the plasma such that it allows control of dimensions and anisotropy of etched features. A filter may be disposed between the bias drive source and the electrode, and configured to pass bias energy to the electrode and block RF source energy from reaching the bias drive source. In some embodiments the filter may also house an RF source termination. The RF source termination may be configured to provide a designed termination impedance. In a preferred embodiment, for example, to act as a very low impedance path, sometimes referred to as a 'short' at the frequency of the RF source.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

Illustrative embodiments of the present invention are described in detail below with reference to the following drawing figures.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 1:
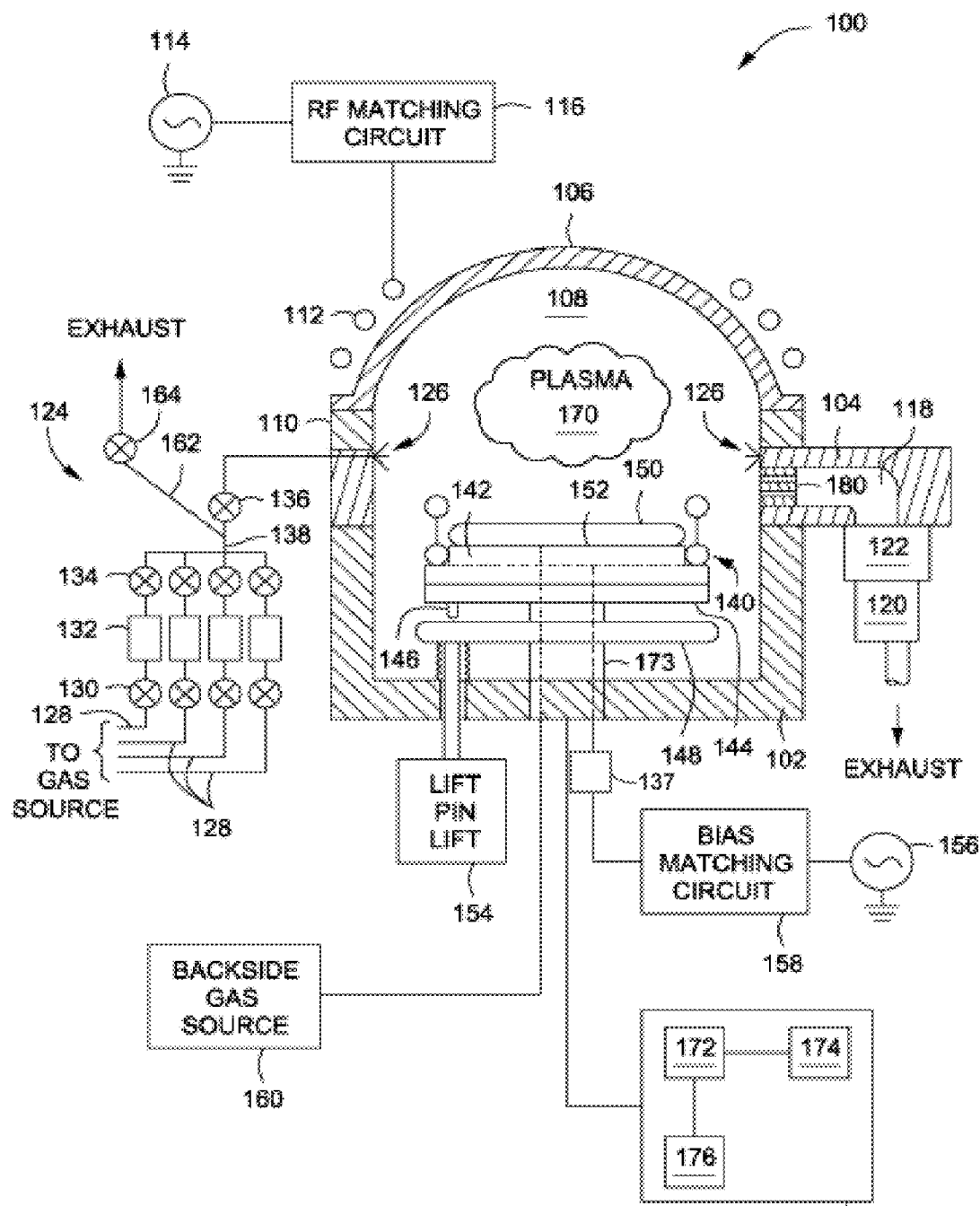
FIG. 1 depicts a sectional view of an example of an etch reactor in accordance with some embodiments of the present invention.

FIG. 1 depicts a sectional view of an example of an etch reactor 100 in accordance with some embodiments of the present invention. Etch reactor 100 uses radio frequency (RF) power from RF source 114 to create a plasma 170 that operates on a substrate (e.g., a silicon wafer) 150. Substrate 150 is placed on an electrode which incorporates an electrostatic chuck 142. The electrode acts as a ground return path for RF source 114 energy. A separate frequency from a bias power source 156 may be used to apply bias power to the lower electrode to increase the etch rate and anisotropy of etch reactor 100, as discussed in more detail below.

Several problems may arise when one frequency is used to power plasma 170 and another frequency is used to apply a bias voltage to the electrode. The combination of the RF source energy and the bias energy may result in an inconsistent voltage potential on the electrode. This inconsistent voltage potential on the electrode may result in inconsistent acceleration of ions from plasma 170 into substrate 150, increasing the variation in etch depth of substrate 150. More specifically, if the impedance of electrode 140 to ground is left to chance, then the stability of the voltages at the electrode surface may be unrepeatable and the etch depth of substrate 150 may be inconsistent, as will be shown in more detail below. Additionally, if there is a bias power source 156 control circuit that is affected by the source energy, it can interfere with precise metering and control of the bias drive source. More specifically, in some embodiments, bias drive 156 control circuitry may be "contaminated" by the source frequency resulting in an increased variation in etch depth.

In some embodiments, a termination having a designed impedance to ground may be coupled to the electrode. In further embodiments, the termination may be designed as a "short" at the frequency of RF source 114 to minimize voltage fluctuations of the electrode due to the RF source energy. In some embodiments a filter 137 may be disposed between the electrode and bias power source 156. Filter 137 may be used to block RF source 114 energy from reaching bias power source 156 while allowing energy from the bias power source to reach the electrode. In an embodiment, filter 137 may also house and/or be integrated with the termination. These and other aspects of filter 137 will be described in more detail below.

Etch reactor 100 includes a lower chamber body 102, an upper chamber body 104, and a ceiling 106 which enclose a process volume 108. Ceiling 106 may be flat or have other geometry. In one embodiment, ceiling 106 is a dome. An interchangeable spacer 110 is provided between ceiling 106 and upper chamber body 104 so that the inclination and/or height of ceiling 106 relative to upper chamber body 104 may be selectively changed as desired.

An RF coil 112 is disposed above ceiling 106 and coupled to RF source 114 through a matching circuit 116. Ceiling 106 is transmissive to the RF power such that RF source power applied to RF coil 112 from RF source 114 may be inductively coupled to and energize gases disposed in a process volume 108 of reactor 100 to maintain a plasma 170.

The source power may be provided at a radio frequency within a range from about 2 MHz to about 60 MHz at a power within a range from about 10 watts to about 5000 watts. The source power may be pulsed. In some embodiments the source power is applied at a frequency of 13.56 MHz. Other frequencies and powers may be employed without departing from the invention.

The upper chamber body 104 includes a pumping channel 118 that connects process volume 108 of reactor 100 to a pump 120 through a throttle valve 122. Pump 120 and throttle valve 122 may be operated to control the pressure within process volume 108 of reactor 100. Pump 120 also removes etch by-products. A baffle plate 180 may be disposed in pumping channel 118 to minimize contamination of pump 120 and to improve conductance within process volume 108.

Etch reactor 100 may have a fast gas exchange system 124 coupled thereto that provides process and/or other gases to process volume 108 through nozzles 126 positioned around the interior of upper chamber body 104 or other suitable location. Fast gas exchange system 124 selectively allows any singular gas or combination of gases to be provided to process volume 108. In some embodiments, fast gas exchange system 124 has four delivery lines 128, each coupled to a different gas source. Delivery lines 128 may be coupled to the same or different nozzles 126.

In the embodiment depicted in FIG. 1, each delivery line 128 includes a first valve 130, a mass flow meter 132, and a second valve 134. Second valves 134 are coupled to a common tee 138, which is coupled to nozzles 126. The conduits through which gases flow from mass flow meters 132 to process volume 108 may be less than about 2.5 m in length, thereby allowing faster switching times between gases. Fast gas exchange system 124 may be isolated from process volume 108 of etch reactor 100 by an isolation valve 136 disposed between tee 138 and nozzles 126.

An exhaust conduit 162 may be coupled between isolation valve 136 and tee 138 to allow residual gases to be purged from fast gas exchange system 124 without entering etch reactor 100. A shut off valve 164 is provided to close exhaust conduit 162 when gases are delivered to process volume 108 of etch reactor 100.

The gas sources coupled to fast gas exchange system 124 may provide gases, including but not limited to, sulfur hexafluoride ($SF_6$), oxygen ($O_2$), argon (Ar), trifluoromethane ($CHF_3$), octafluorocyclobutane ($C_4F_8$), nitrogen trifluoride ($NF_3$), carbon tetrafluoride ($CF_4$), trifluoromethane ($CHF_3$), chlorine trifluoride ($ClF_3$), bromine trifluoride ($BrF_3$), iodine trifluoride ($IF_3$), a helium-oxygen gas mixture (He:$O_2$), a helium-hydrogen gas mixture (He:$H_2$), hydrogen ($H_2$), helium (He), and/or other gases for use in the processes as described herein. The flow control valves may include pneumatic operation to allow rapid response. In one example, fast gas exchange system 124 is operable to deliver $SF_6$ and $C_4F_8$ at up to about 1000 sccm, helium at about 500 sccm, and oxygen ($O_2$) and argon at about 200 sccm. In an alternative embodiment, fast gas exchange system 124 may further include a third gas panel comprising of a plasma sustaining gas, such as argon and/or He, and operable to continuously deliver the gas to etch reactor 100 during the cyclical etching method described further below.

Etch reactor 100 may additionally include a substrate support assembly 140 disposed in process volume 108. Substrate support assembly 140 includes an electrostatic chuck 142 mounted on a thermal isolator 144. Thermal isolator 144 insulates electrostatic chuck 142 from a stem 173 that supports electrostatic chuck 142 above the bottom of lower chamber body 102.

Lift pins 146 are disposed through substrate support assembly 140. A lift plate 148 is disposed below substrate support assembly 140 and may be actuated by a lift 154 to selectively displace lift pins 146 to lift and/or place a substrate 150 on an upper surface 152 of electrostatic chuck 142.

Electrostatic chuck 142 includes at least one electrode (the bottom electrode) which may be energized to electrostatically retain substrate 150 to upper surface 152 of electrostatic chuck 142. An electrode of electrostatic chuck 142 is coupled to bias power source 156 through a matching circuit 158. Bias power source 156 may selectively energize the electrode of electrostatic chuck 142 to control the directionality of plasma 170 ions during etching.

The bias power applied to electrostatic chuck 142 by bias power source 156 may be pulsed, e.g. repeatedly storing or collecting the energy over a time period and then rapidly releasing the energy over another time period to deliver an increased instantaneous amount of power, while the source power may be continuously applied. In particular, the bias power may be pulsed using generator pulsing capability set by a control system to provide a percentage of time that the power is on, which is referred to as the duty cycle. In one embodiment, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz. In one embodiment, a specialized pulsing profile where the on/off timing changes during the etching cycles may be used. In one embodiment, by changing the bias power applied to the substrate, the etching cycle may switch between the deposition and/or etching steps. The bias power is pulsed to help reduce scalloping of the trench sidewalls (improve anisotropy), improve resist selectivity, improve the etch rate, and prevent material interface notching.

The bias power may be provided within a range from DC to about 1 MHz at a power within a range from about 1 watt to about 5000 watts. In some embodiments the bias power is applied at a frequency of 400 kHz. Other frequencies and powers may be employed without departing from the invention.

In some embodiments a backside gas source 160 may be coupled through substrate support assembly 140 to provide one or more gases to a space defined between substrate 150 and upper surface 152 of electrostatic chuck 142. Gases provided by backside gas source 160 may include He and/or a backside process gas. The backside process gas is a gas delivered from between the substrate and the substrate support which affects the rate of etch or polymerization during the etch cycle by reacting with the materials in the chamber, such as process gases, etch by-products, mask or other layers disposed on the substrate or the material targeted for etching. In some embodiments, the backside process gas is an oxygen containing gas, such as $O_2$. In some embodiments, a ratio of He to $O_2$ in the backside gas is about 50:50 to about 70:30 by volume or by mass for silicon etch applications. It is contemplated that other backside process gases may be utilized to control the processes near the edge of the substrate. The use of backside process gases may be used beneficially for single step etch processes as well as cyclical etch processes.

To enable the process gas provided by backside gas source 160 to reach the edge of substrate 150, the rate of backside gas leakage from under the edge of substrate 150 may be higher than that of conventional backside gas systems. In some embodiments, the leak rate may be elevated by maintaining the pressure of the gases in a space between substrate 150 and upper surface 152 of electrostatic chuck 142 between about 4 and 26 Torr. In some embodiments, the pressure may be maintained between about 10 and 22 Torr. In some embodiments, the pressure may be maintained between about 14 and 20 Torr. The leak rate may also be achieved by providing notches or other features in a lip supporting substrate 150 and upper surface 152 of electrostatic chuck 142 which promotes leakage of the backside gas between electrostatic chuck 142 and substrate 150.

Further as shown in FIG. 1, etch reactor 100 may include a controller 171 which generally comprises a central processing unit (CPU) 172, a memory 174, and support circuits 176 and is coupled to and controls etch reactor 100 and various system components, such as RF source 114, bias source 156, fast gas exchange system 124 and the like, directly (as shown in FIG. 1) or, alternatively, via other computers or controllers (not shown) associated with the process chamber and/or the support systems. Controller 171 may be one of any form of general-purpose computer processor that can be used in an industrial setting for controlling various chambers and sub-processors. Memory, or computer-readable medium, 174 of CPU 172 may be one or more of readily available memory such as random access memory (RAM), read only memory (ROM), floppy disk, hard disk, or any other form of digital storage, local or remote. Support circuits 176 are coupled to CPU 172 for supporting the processor in a conventional manner. These circuits include cache, power supplies, clock circuits, input/output circuitry and subsystems, and the like. Myriad processes may be stored in memory 174 as software routines. The software routine, when executed by the CPU 172, transforms the general purpose computer into a specific purpose computer (controller) 178 that controls the operation of etch reactor 100. The software routine may also be stored and/or executed by a second CPU (not shown) that is remotely located from the hardware being controlled by CPU 172 of controller 174. Other configurations of etch reactor 100 are known to those of skill in the art, are within the scope of this disclosure and may be employed in other embodiments.

Figure 2:
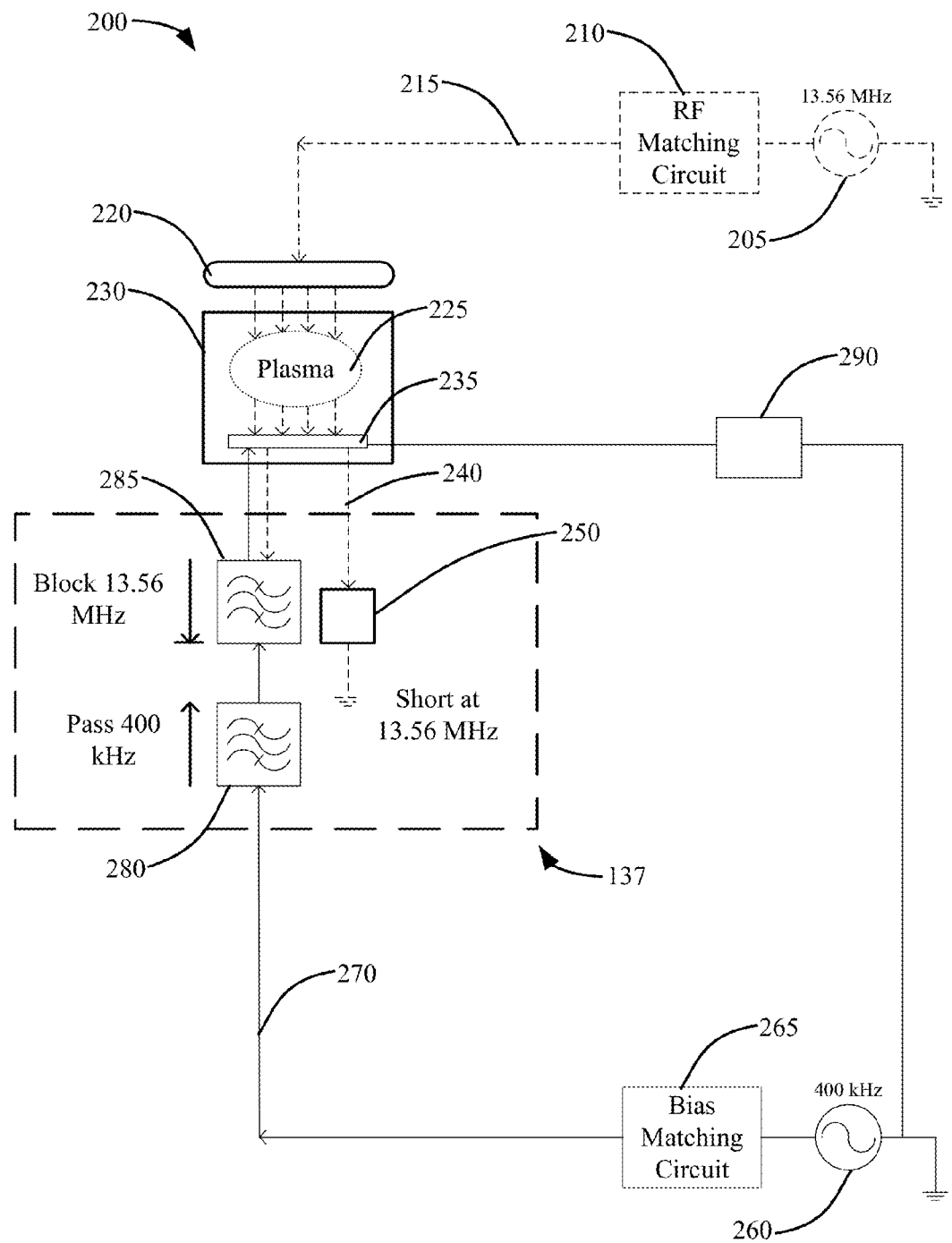
FIG. 2 depicts a functional schematic of an example of a plasma etch system in accordance with some embodiments of the present invention.

A functional schematic of a plasma etch system 200 in accordance with embodiments of the invention is shown in FIG. 2. FIG. 2 is for illustrative purposes and other frequencies and circuit architectures may be employed without departing from the invention. An RF source 205 operating at 13.56 MHz powers an RF induction coil 220 through an RF matching circuit 210. As defined herein, matching, matching circuits and impedance matching shall mean that the real part of the impedance should be approximately equal to the real part of the load and reactance's should be approximately equal and opposite in character. In some embodiments, RF source 205 may operate in a delivered power mode where a control system maintains a constant level of delivered power to RF induction coil 220. Delivered power is equal to the measured forward power (power from RF source 205) minus the measured reflected power. In other embodiments, RF source 205 may operate in a forward power mode where reflected power is not compensated for.

RF source 205 is coupled to RF matching circuit 210 and RF induction coil 220 by RF conduit 215. The path of the 13.56 MHz RF source 205 energy is shown with a dashed line for clarity. Induction coil 220 generates a plasma 225 within chamber 230. RF matching circuit 210 corrects the electromagnetic match of induction coil 220 to that of RF source 205 to maximize power transfer from the RF source to the RF induction coil. RF source 205 energy is then coupled from plasma 225 to electrode 235 through RF source ground path 240 in filter 137. In some embodiments RF matching circuit 210 is variable and dynamically changes impedance to compensate for changes in plasma 225 impedance. In other embodiments, RF matching circuit 210 is fixed and the frequency of RF source 205 may be varied to compensate for changes in plasma 225 impedance. In such embodiments the impedance of the fixed RF matching circuit 210 may change with frequency. RF drive 205 output frequency may be either statically or dynamically altered to improve impedance matching.

A bias drive source 260 operating at 400 kHz applies a bias to electrode 235 through a bias drive matching circuit 265 and filter 137. Bias drive source 260 applies electromagnetic energy to electrode 235 to accelerate ions from plasma 225 into substrate 150 (see FIG. 1) to increase the etch rate of substrate 150 (see FIG. 1) and increase etch anisotropy. Thus the voltage potential of electrode 235 affects both the rate of etch and feature attributes of substrate 150. In some embodiments, bias source 260 may operate in a delivered power mode where a control system maintains a constant level of delivered power to electrode 235. Delivered power is equal to the measured forward power (power from bias source 260) minus the measured reflected power. In other embodiments, bias source 260 may operate in a forward power mode where reflected power is not compensated for.

Bias conduit 270 connects bias source 260 to bias matching circuit 265, filter 137 and electrode 235. The path of the 400 kHz energy is shown with a solid line for clarity. In embodiments where bias drive source 260 uses RF energy, bias matching circuit 265 transforms the electromagnetic impedance of electrode 235 to equal or close to the designed output impedance of bias drive source 260 to maximize power transfer from the bias source to the electrode. In some embodiments bias matching circuit 265 is variable and dynamically changes impedance to compensate for changes in impedance. In other embodiments, bias matching circuit 265 is fixed and the frequency of bias source 260 may be varied to compensate for changes in impedance. In such embodiments the impedance of the fixed bias matching circuit 265 may change with frequency. Bias drive 260 output frequency may be either statically or dynamically altered to improve impedance matching. In some embodiments, an RF sensor 290 is connected to electrode 235 and used to control bias drive source 260 or provide open-loop monitoring of applied power. In further embodiments, RF sensor 290 may be housed with filter 137. In some embodiments, bias matching circuit 265 may be housed with filter 137 and optional RF sensor 290.

To sustain a plasma, a closed loop circuit from RF source 205, through plasma 225, through substrate 150, through electrode 235, through termination 250 to ground and back to the RF source is used. Thus, termination 250 terminates RF source 205 energy to ground. In some embodiments, termination 250 is designed to minimize voltage fluctuations in electrode 235 by "shorting" the 13.56 MHz RF source 205 energy to ground by providing a designed low impedance path to minimize voltage at the electrode surface. This "short" may serve to sufficiently attenuate voltage fluctuations on electrode 235 due to RF source 205 energy such that the voltage potential of electrode 235 may be accurately and consistently controlled with bias drive source 260. The improved accuracy and consistency of control of voltage on electrode 235 may provide improved consistency and uniformity of the etch rate of substrate 150 of etch system 200. Other embodiments of termination 250 may be designed to be an "open" or a "load", or other termination impedance at the frequency of RF source 205. The RF power circuit may be designed considering, but not limited to, RF matching network 210, RF conduit 215, RF induction coil 220, plasma 225, electrode 235 and termination 250. The design may be performed using electromagnetic lumped element or full-field solver simulation tools. Common tools for such implementations are PSPICE from Cadence Incorporated and HFSS from Ansys Incorporated. In some embodiments termination 250 may not be housed with filter 137.

In further embodiments that employ RF sensor 290 to control bias drive source 260, the reduced voltage fluctuation of electrode 235 due to the "shorted" RF source 205 energy may result in increased accuracy and repeatability of the RF sensor. The improved accuracy and repeatability may enable bias drive 260 to apply a more consistent and repeatable bias to electrode 235, resulting in improved consistency and uniformity of the etch rate of substrate 150 of etch system 200. In other embodiments, RF sensor 290 may not be used to control bias drive source 260, or may have a selective response that only responds to RF source 205 energy.

In some embodiments, filter 137 may be configured to perform one or more functions related to RF source 205 and/or bias drive source 260. Filter 137 may use blocking circuit 285 to perform the function of blocking the 13.56 MHz RF source energy from being coupled from electrode 235 to bias drive source 260 through bias conduit 270. In still further embodiments, filter 137 may also be configured to allow bias drive source 260 energy to pass through to electrode 235, using, for example, filtering circuit 280. In some embodiments, a low pass filter may be used to perform the blocking and passing functions, while in other embodiments a band pass or other filter may be used. In further embodiments, filter 137 may be integrated including the functions of blocking, passing and terminating while in other embodiments filter 137 may be componentized wherein each function is performed independently. In other embodiments, bias matching circuit 265 may be integrated with filter 137. The frequencies employed in etch system 200 are for example only, other and additional frequencies including a DC bias may be employed without departing from the invention.

Figure 3:
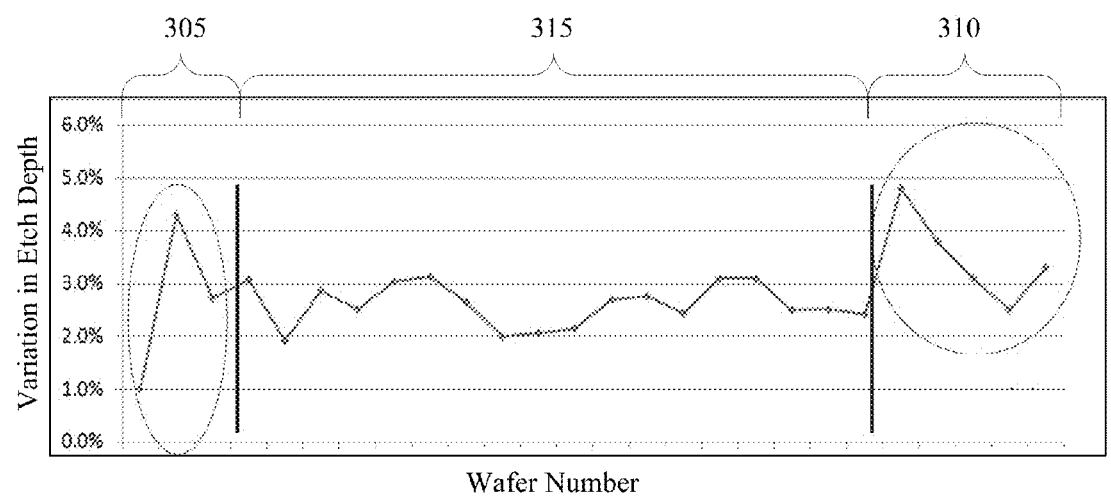
FIG. 3 shows a graph illustrating the variation in etch depth of wafers in accordance with some embodiments of the invention.

The graph illustrated in FIG. 3 shows the effect of filter 137 in some embodiments. The first three wafers 305 and the last four wafers 310 were performed without using filter 137. These wafers show the large non-uniformity in etch depth, which ranges from approximately 1% to 5%. For some products, this non-uniformity is unacceptable for production. Embodiments of the invention reduce the variation in etch depth as shown in middle wafers 315. The variation in middle wafers 315 ranges from approximately 2% to 3%, demonstrating an improvement in consistency of etch depth.

Figure 4:
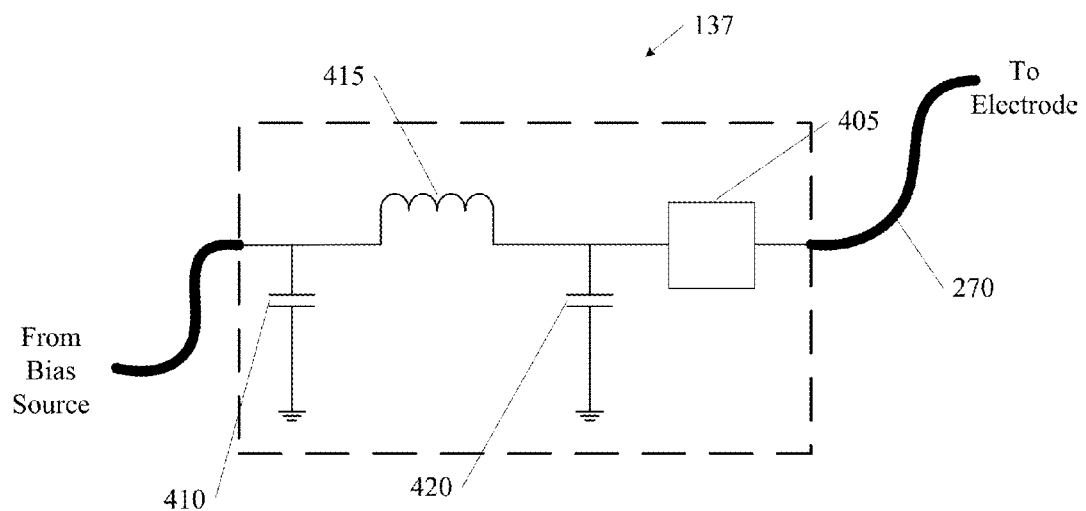
FIG. 4 shows an example of a filter according to some embodiments of the invention.

FIG. 4 shows an example of filter 137 used in some embodiments. Other configurations of filter 137 may be employed and are within the scope of this disclosure. Filter 137 can be coupled in series (or inline) between electrode 235 (see FIG. 2) and bias power source 260. Filter 137 may perform blocking, passing, termination and sensing functions for etch system 200 (see FIG. 2). As illustrated, in this embodiment, filter 137 includes inductor 415, first capacitor 410, and second capacitor 420. Inductor 415 may be disposed between first capacitor 410 and second capacitor 420. First capacitor 410 and second capacitor 420 may be connected to ground. In one embodiment, inductor 415 may have a value of approximately 4 microhenries, first capacitor 410 may have a value of approximately 1200 picofarads and second capacitor 420 may have a value between approximately 150 to 200 picofarads. In some embodiments, second capacitor 420 may be matched to the impedance of bias conduit 270 that connects to electrode 235 (see FIG. 2), which may depend on the length of the bias conduit.

In some embodiments, RF sensor 405 may also be included in series with filter 137 and may or may not be housed with filter 137. RF sensor 405 may provide feedback to bias drive source 260 (see FIG. 2) to manage electrode 235 voltage and the rate of etch of substrate 150 (see FIG. 1). In some embodiments bias conduit 270 may be coupled directly to filter 137, for example, without a removable connector. The design and selection of components for filter 137 may vary depending, for example, on the type of deposition or etch system, RF source 205 frequency, RF source 205 impedance, RF matching circuit 210 characteristics, RF conduit 215, plasma 225 characteristics, electrode 235 impedance, bias power source 260 impedance, bias matching circuit 265 characteristics, bias conduit 270 characteristics and the characteristics of the other components contained in filter 137. The values and configuration of the electrical components within filter 137 may be changed and such alterations are within the scope of this disclosure.

For example, in some embodiments, filter 137 may be designed to have a 3 DB cutoff frequency of approximately 4.2 MHz, passing energy at 400 kHz and attenuating energy at 13.56 MHz. In other embodiments, inductor 415 may have a value of 3.79 microhenries, first capacitor may have a value of 757.9 picofarads and second capacitor may have a value of 757.9 picofarads. In further embodiments filter 137 can be designed with an increased number of poles to change the slope of the attenuation curve. In some embodiments filter 137 may be designed to be a single pole, a two pole, a three pole or other configuration of a low pass filter. In further embodiments, filter 137 may be designed to be a bandpass filter. In other embodiments of filter 137, termination impedance 250 (see FIG. 2) to ground for RF source energy can be designed to be a matched short, a matched open, a matched load or anything in between. Termination 250 design can be used to manage electrode 235 (see FIG. 2) voltage and current. In some embodiments termination 250 impedance to ground is designed to minimize the voltage fluctuation of electrode 235. Embodiments of the invention may also improve bias source 260 (see FIG. 2) voltage signal quality and/or dampen any interference from other RF frequencies (e.g., RF source 205 frequency). Myriad configurations of filter 137 are within the scope of this disclosure.

In some embodiments, filter 137 can be housed within an enclosure and placed near electrode 235. The enclosure can be constructed to protect the electrical components from the harsh deposition and/or etching environment that may be found within the chamber.

Figure 5:
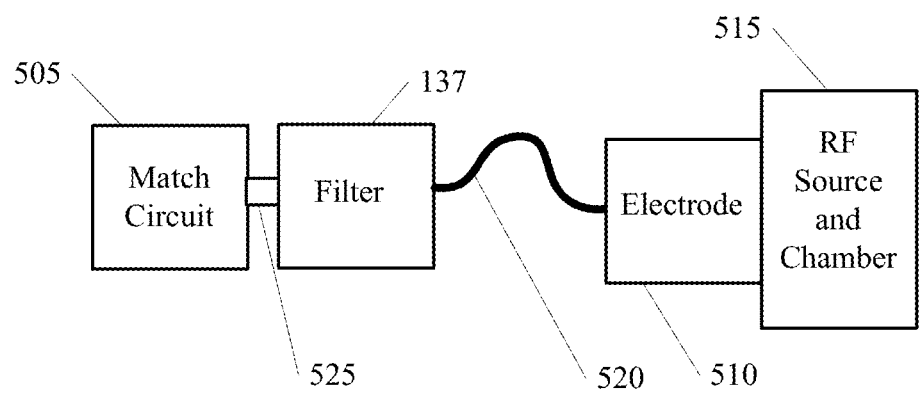
FIG. 5 shows an example of a filter disposed between a match and an electrode according to some embodiments of the invention.

FIG. 5 shows another example of filter 137 coupled with an RF source and chamber 515. Filter 137 can be coupled with match circuit 505 using a connector 525. In the figure, an example connector is shown as a quick disconnect coaxial connector. Match circuit 505 can be used to match the impedance of electrode 510. Filter 137 is coupled with electrode 510 using cable 520. Electrode 510 is then coupled with RF source and chamber 515.

Figure 6:
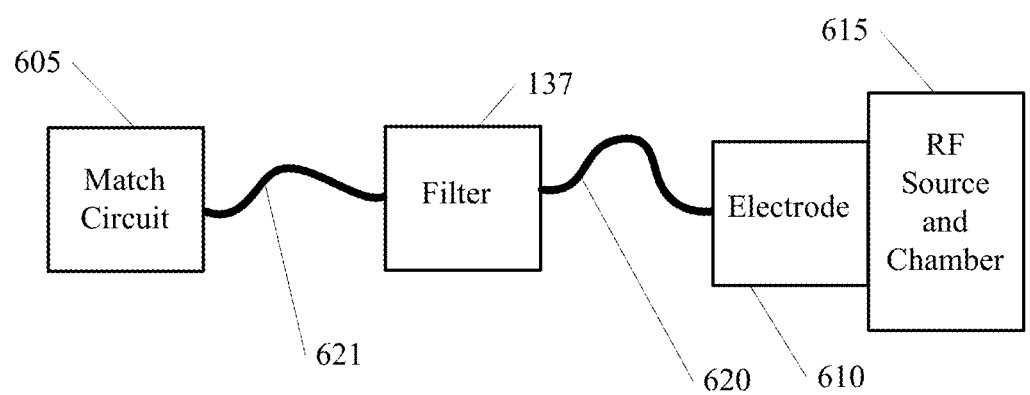
FIG. 6 shows an example of a filter disposed between a match and an electrode according to some embodiments of the invention.
Figure 7:
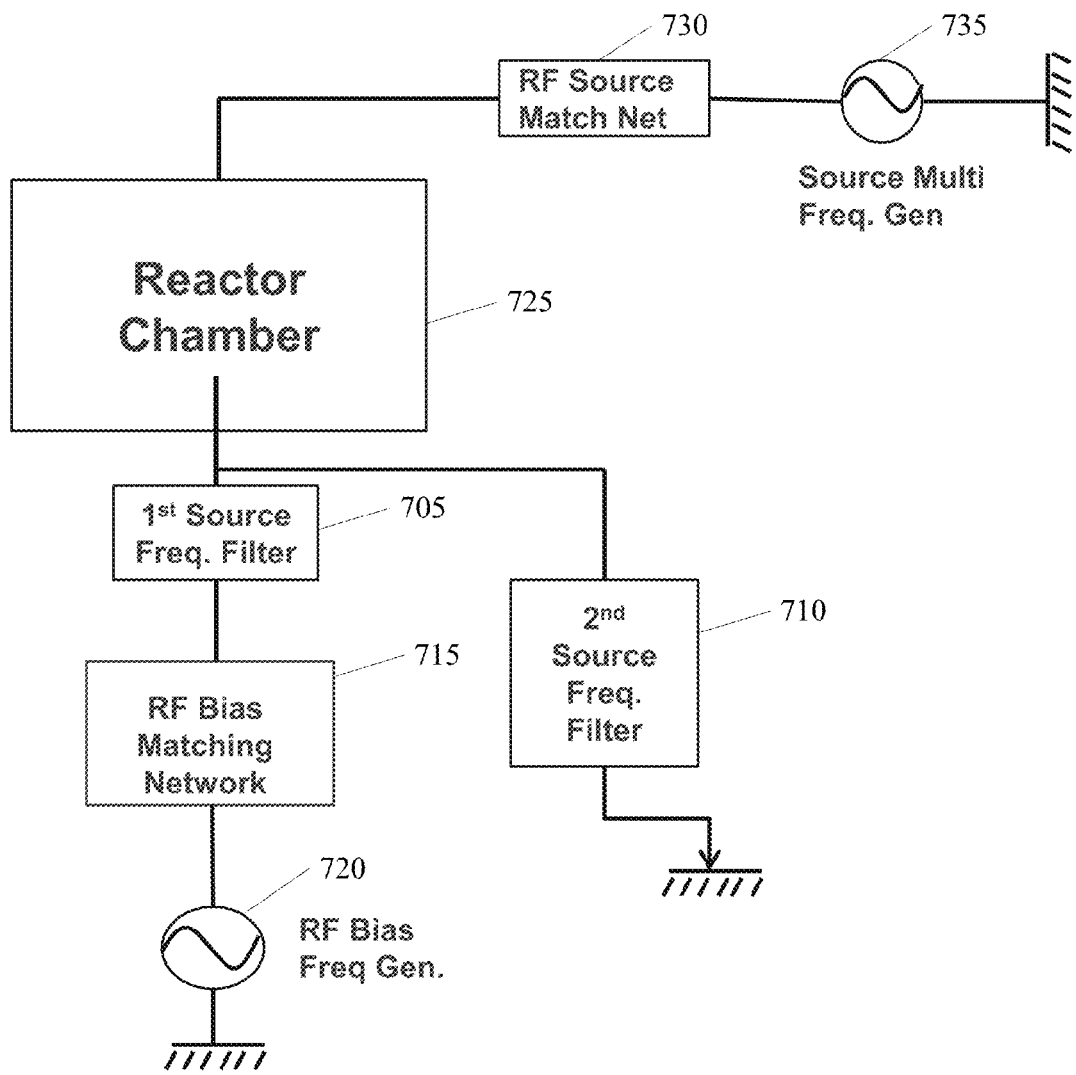
FIG. 7 shows an example of a system with two filters according to some embodiments of the invention.

FIG. 6 shows yet another example of filter 137 coupled with an RF source and chamber 615. Filter 137 can be coupled with match circuit 605 and electrode 610 with cable 620 and cable 621, respectively. As shown in FIGS. 6 and 7, filter 137 can be placed between match circuit 605 and electrode 610 in different of configurations. Various other configurations may be used, including positions between bias source and electrode.

FIG. 7 shows an example of a system with two separate filters according to some embodiments of the invention. This embodiment can be used for a number of different reasons such as, for example, to filter out two or more frequencies. RF source 735 may apply power to reactor chamber 725 through RF source matching network 730. First source filter 705 can be coupled with an electrode in chamber 725 and match circuit 715, which is coupled with RF bias generator 720. Second filter 710 can be coupled with ground and reactor chamber 725 through the electrical channel between first filter 705 and chamber 725. This system can be used, for example to attenuate more than one source frequency. In some embodiments both first filter 705 and second filter 710 can be disposed within the same housing. In other embodiments, second filter 710 may be a matched impedance termination for source 735.

Embodiments of the invention can be used with multi frequency MEMS etch configurations. In some embodiments a low pass filter or a first source frequency filter can be used. Some embodiments can used in multi-frequency plasma processing apparatus (i.e. for CVD, or etch systems). In some embodiments the source and Bias frequency combinations do not have to be strictly similar to MEMS etch configuration (i.e. 13.56 MHz source, and 400 KHz Bias). In some embodiments a combination of any other two frequencies can be applicable using one filer (i.e. LPF/First Source Frequency Filter).

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

A computational system can be used to perform any of the embodiments of the invention. For example, the computational system can be used to execute methods and/or processes that control etch depth. As another example, the computational system can be used perform any calculation, identification and/or determination described here. The computational system includes hardware elements that can be electrically coupled via a bus (or may otherwise be in communication, as appropriate). The hardware elements can include one or more processors, including without limitation one or more general-purpose processors and/or one or more special-purpose processors (such as digital signal processing chips, graphics acceleration chips, and/or the like); one or more input devices, which can include without limitation a mouse, a keyboard and/or the like; and one or more output devices, which can include without limitation a display device, a printer and/or the like.

The computational system may further include (and/or be in communication with) one or more storage devices, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system might also include a communications subsystem, which can include without limitation a modem, a network card (wireless or wired), an infrared communication device, a wireless communication device and/or chipset (such as a Bluetooth device, an 802.6 device, a WiFi device, a WiMax device, cellular communication facilities, etc.), and/or the like. The communications subsystem may permit data to be exchanged with a network (such as the network described below, to name one example), and/or any other devices described herein. In many embodiments, the computational system will further include a working memory, which can include a RAM or ROM device, as described above.

The computational system also can include software elements, shown as being currently located within the working memory, including an operating system and/or other code, such as one or more application programs, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) described above.

In some cases, the storage medium might be incorporated within the computational system or in communication with the computational system. In other embodiments, the storage medium might be separate from a computational system (e.g., a removable medium, such as a compact disc, etc.), and/or provided in an installation package, such that the storage medium can be used to program a general purpose computer with the instructions/code stored thereon. These instructions might take the form of executable code, which is executable by the computational system and/or might take the form of source and/or installable code, which, upon compilation and/or installation on the computational system (e.g., using any of a variety of generally available compilers, installation programs, compression/decompression utilities, etc.) then takes the form of executable code.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A substrate processing system comprising:
   a radio frequency (RF) source configured to generate RF source energy in a first frequency band to form a plasma within the system, wherein the RF source is terminated through an electrode;
   a bias source coupled to the electrode to apply bias energy to the electrode;
   a first filter disposed between the bias source and the electrode, the first filter configured to pass the bias energy to the electrode, block RF source energy in the first frequency band from reaching the bias source and provide a low impedance to ground for the RF source energy in the first frequency band; and
   an RF sensor disposed in serial with the first filter, wherein both the RF sensor and the first filter that is configured to pass the bias energy to the electrode and provide the low impedance to ground for the RF source energy in the first frequency band are disposed between the electrode and the bias source, and the RF sensor is configured to provide an indication of a voltage potential of the electrode.

2. The substrate processing system of claim 1, wherein the low impedance to ground for the RF source energy in the first frequency band is configured as an RF short at the first frequency band of the RF source energy.

3. The substrate processing system of claim 1, wherein the first filter is a low pass filter.

4. The substrate processing system of claim 3, wherein the low pass filter comprises an inductor, a first capacitor and a second capacitor.

5. The substrate processing system of claim 4, wherein the inductor has a value of approximately 4 microhenries, the first capacitor has a value of approximately 1200 picofarads and the second capacitor has a value of approximately 150 to 200 picofarads.

6. The substrate processing system of claim 1, wherein the first filter is a band pass filter.

7. The substrate processing system of claim 1, wherein the RF source generates a first frequency and the bias source generates a second frequency that is different from the first frequency.

8. The substrate processing system of claim 1, wherein the RF source generates a first frequency of approximately 13.56 MHz and the bias source generates a second frequency of approximately 400 kHz.

9. The substrate processing system of claim 1, wherein the RF sensor is housed with the first filter.

10. A substrate processing system comprising:
 a substrate processing chamber;
 a substrate support positioned within and configured to be an electrode within the substrate processing chamber;
 a radio frequency (RF) source configured to generate RF source energy to form a plasma within the chamber from gases introduced into the chamber, wherein the RF source energy is coupled through the electrode and through a termination to ground;
 a bias source coupled to the electrode to apply bias energy to the electrode;
 a filter disposed between the electrode and the bias source, wherein the filter is configured to pass the bias energy to the electrode and to provide a low impedance to ground for the RF source energy; and
 an RF sensor disposed in serial with the filter, both the RF sensor and the filter disposed between the electrode and the bias source, and the RF sensor configured to selectively measure voltage of one of the RF source energy or the bias energy on the electrode.

11. The substrate processing system according to claim 10, wherein the filter is configured to block the RF source energy from reaching the bias source.

12. The substrate processing system according to claim 10, wherein the termination to ground is configured to have a designed impedance at a frequency of the RF source.

13. The substrate processing system according to claim 10, wherein the termination to ground is configured as a short to ground at a frequency of the RF source.

14. The substrate processing system according to claim 10, wherein the termination to ground is contained in a common housing with the filter.

* * * * *